(12) United States Patent
Cho et al.

(10) Patent No.: US 7,969,777 B1
(45) Date of Patent: *Jun. 28, 2011

(54) THYRISTOR-BASED MEMORY ARRAY HAVING LINES WITH STANDBY VOLTAGES

(75) Inventors: Hyun-Jin Cho, Palo Alto, CA (US); Farid Nemati, Redwood City, CA (US)

(73) Assignee: T-RAM Semiconductor, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/326,027

(22) Filed: Dec. 1, 2008

Related U.S. Application Data

(62) Division of application No. 11/159,447, filed on Jun. 22, 2005, now Pat. No. 7,460,395.

(51) Int. Cl.
*G11C 11/39* (2006.01)
(52) U.S. Cl. ......... 365/180; 365/175; 365/174; 365/229
(58) Field of Classification Search .................. 365/175, 365/180, 174, 159, 229, 226
See application file for complete search history.

(56) References Cited

U.S. PATENT DOCUMENTS

| | | | | |
|---|---|---|---|---|
| 4,604,728 A | 8/1986 | Okajima | | 365/165 |
| 5,285,083 A | 2/1994 | Pulfrey et al. | | 257/52 |
| 5,412,598 A | 5/1995 | Shulman | | 365/174 |
| 5,514,882 A | 5/1996 | Shulman | | 257/105 |
| 6,046,475 A | 4/2000 | Chang et al. | | |
| 6,104,045 A | 8/2000 | Forbes et al. | | 257/141 |
| 6,128,216 A | 10/2000 | Noble, Jr. et al. | | 365/154 |
| 6,225,165 B1 | 5/2001 | Noble, Jr. et al. | | 438/268 |
| 6,229,161 B1 | 5/2001 | Nemati et al. | | 257/133 |
| 6,462,359 B1 | 10/2002 | Nemati et al. | | 257/107 |
| 6,503,790 B2 | 1/2003 | Noble, Jr. et al. | | 438/237 |
| 6,545,297 B1 | 4/2003 | Noble, Jr. et al. | | 257/124 |
| 6,727,528 B1 | 4/2004 | Robins et al. | | 257/133 |
| 6,767,770 B1 | 7/2004 | Horch et al. | | 438/133 |
| 6,790,713 B1 | 9/2004 | Horch | | 438/135 |
| 6,815,734 B1 | 11/2004 | Horch et al. | | |
| 6,818,482 B1 | 11/2004 | Horch et al. | | 438/138 |
| 6,885,581 B2 | 4/2005 | Nemati et al. | | 365/159 |
| 6,888,176 B1 | 5/2005 | Horch et al. | | |
| 6,944,051 B1 | 9/2005 | Lee et al. | | |
| 7,042,759 B2 | 5/2006 | Nemati et al. | | 365/159 |
| 7,075,122 B1 | 7/2006 | Yang et al. | | |
| 7,245,525 B1 | 7/2007 | Lee et al. | | 365/159 |
| 7,460,395 B1 * | 12/2008 | Cho et al. | | 365/180 |
| 2005/0233506 A1 | 10/2005 | Horch et al. | | |
| 2006/0139996 A1 | 6/2006 | Nemati et al. | | 365/177 |
| 2006/0227601 A1 | 10/2006 | Bhattacharyya | | |

OTHER PUBLICATIONS

Shulman, Dima D., "A Static Memory Cell Based on the Negative Resistance of the Gate Terminal of p-n-p-n Devices," IEEE Journal of Solid State Circuits, vol. 29, No. 6, 1994, pp. 733-736.

(Continued)

*Primary Examiner* — Andrew Q Tran
(74) *Attorney, Agent, or Firm* — The Webostad Firm

(57) ABSTRACT

A new memory cell can contain only a single thyristor. There is no need to include an access transistor in the cell. In one embodiment, the thyristor is a thin capacitively coupled thyristor. The new memory cell can be connected to word, bit, and control lines in several ways to form different memory arrays. Timing and voltage levels of word, bit and control lines are disclosed.

18 Claims, 7 Drawing Sheets

OTHER PUBLICATIONS

T. Park et al., "Fabrication of Body-Tied Fin FETs (Omega MOSFETs) Using Bulk Si Wafers," 2003 Symposium on VLSI Technology Digest of Technical Papers.

T. Sugizaki, et al., "Low Voltage/Sub-ns Operation Bulk Thyristor-SRAM (BT-RAM) Cell with Double Selective Epitaxy Emitters *DEE)," 2007 Symposium on VLSI Technology Digest of Technical Papers, pp. 170-171.

* cited by examiner

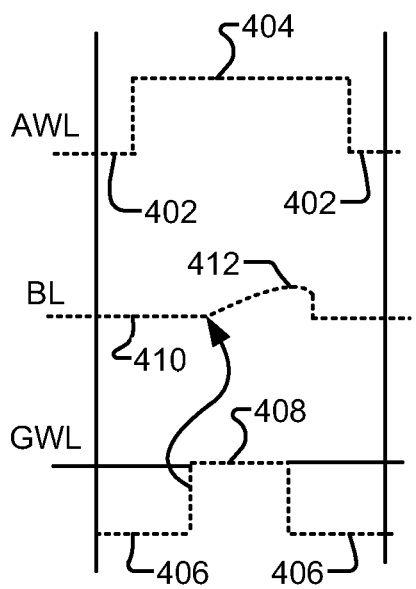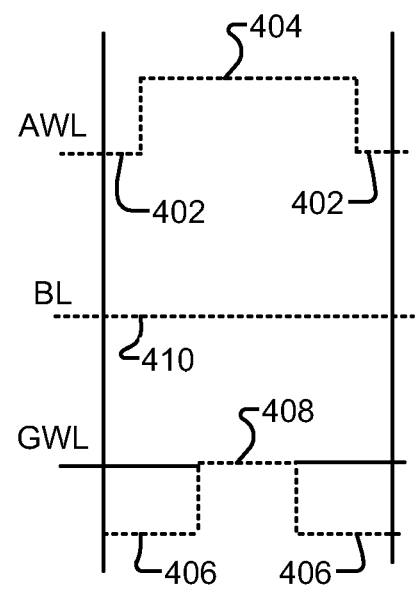
FIG. 7B  FIG. 7A
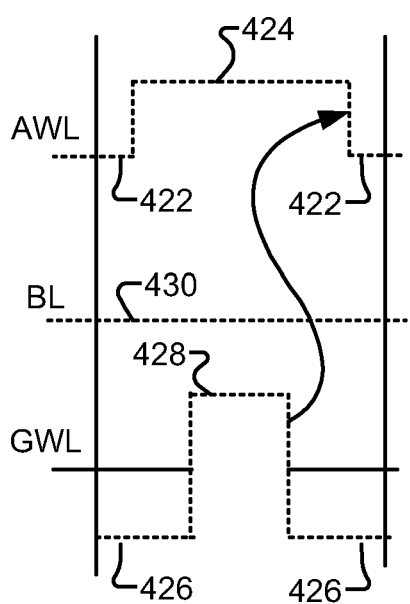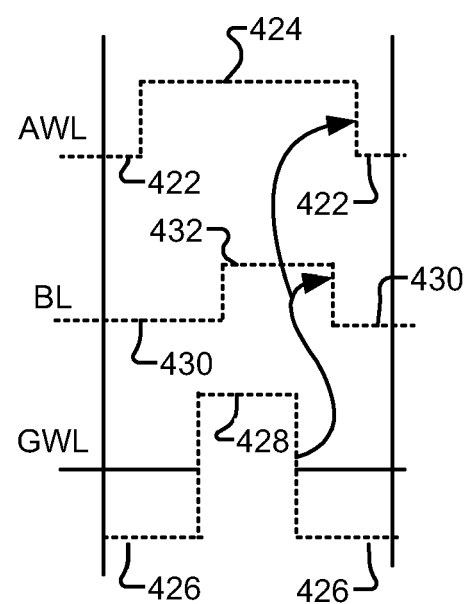
FIG. 8B  FIG. 8A

THYRISTOR-BASED MEMORY ARRAY HAVING LINES WITH STANDBY VOLTAGES

RELATED DATA

This application is a divisional of U.S. application Ser. No. 11/159,447 filed Jun. 22, 2005, now issued as U.S. Pat. No. 7,460,395 on Dec. 2, 2008; the disclosure of which is hereby incorporated by reference in its entirety.

BACKGROUND

The performance of logic has increased by two orders of magnitude over the past decade while the performance of memory has increased by less than a factor of two. Memory has become the critical bottleneck in most systems ranging from servers to routers to communications equipments. For example, the Internet revolution dramatically accelerated network performance requirements, but the technological limits of dynamic random access memory (DRAM) and static random access memory (SRAM) have created a bottleneck defined by the slow speed of DRAMs and the low density of SRAMs. System Designers have struggled for years to find a solution that successfully matches the density of DRAM with the high speed of SRAM. Recently, a new kind of memory cell based on a breakthrough Negative Differential Resistance based (NDR-based) SRAM cell has been developed. It provides the best of both worlds: SRAM speeds paired with DRAM density. The result is a memory cell that is four times faster than existing DRAMs and four times denser than state-of-the-art SRAMs. More detailed information about such memory cell can be found in U.S. Pat. No. 6,229,161.

Although the above mentioned NDR based SRAM memory cell provides better size/performance over conventional SRAM and DRAM, there is a need to further improve the size/performance of memory.

SUMMARY

The present invention relates to a memory cell that has a single thyristor. The cell does not need an access transistor. As a result, the size of the memory cell can be smaller than conventional memory cells. In one embodiment, the thyristor is a thin capacitively coupled thyristor. A plurality of the new memory cells can be connected to word, bit, and control lines to form memory arrays.

Advantages and features of the present invention will be apparent from the following detailed description and accompanying drawings.

DESCRIPTION OF THE DRAWINGS

FIGS. 7A and 7B are signal diagrams for read operations of the present invention.

FIGS. 8A and 8B are signal diagrams for write operations of the present invention.

DETAILED DESCRIPTION

The present invention provides a solution to the above-described needs through inventive memory cell structures and memory array architectures. Specifically, it is found that a single thyristor can be used to implement a memory cell without the need of an access transistor.

In the following description, numerous specific details are set forth to provide an understanding of exemplary embodiments of the present invention, wherein similar elements between the various embodiments may be annotated similarly. Additionally, readily established circuits or elements of the exemplary embodiments may be disclosed in simplified form (e.g., simplified block diagrams and/or simplified description) to avoid obscuring an understanding the embodiments with excess detail. Likewise, to aid a clear and precise disclosure, description of known structures—e.g., sidewall spacers, gate oxides, conductive lines, voltage sources, contacts, vias, etc.—may similarly be simplified where persons of ordinary skill in this art can readily understand such structures and provisions by way of the drawings and present disclosure.

Figure 1A:
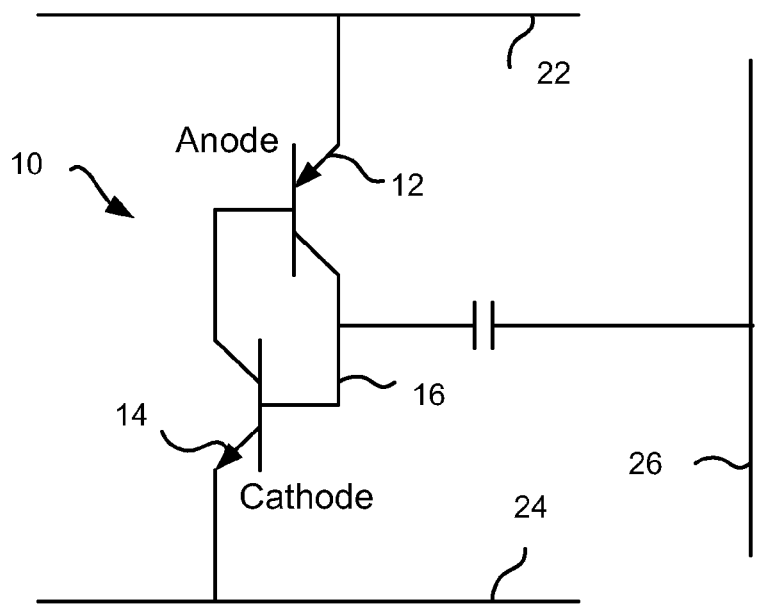
FIGS. 1A to 1C show an exemplary capacitively coupled thyristor memory cell of the present invention.

FIG. 1A is a schematic diagram of a capacitively coupled thyristor memory cell 10 of the present invention. It comprises an anode 12, a cathode 14 and two bases, one of which is labeled 16. Anode 12 is connected to either a bit line, a word line, or a control line. Cathode 14 is connected to one of the two remaining lines. Base 16 is capacitively connected to the last remaining line.

Figure 1D:
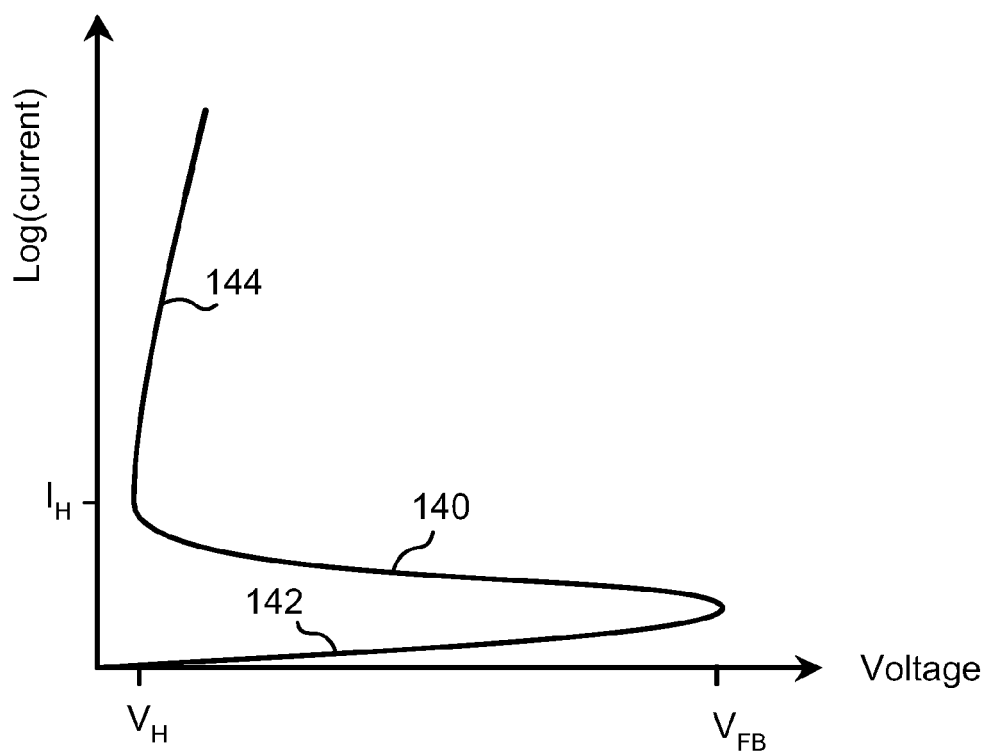
FIG. 1D shows a current-voltage graph of a thyristor of the present invention.
Figure 1B:
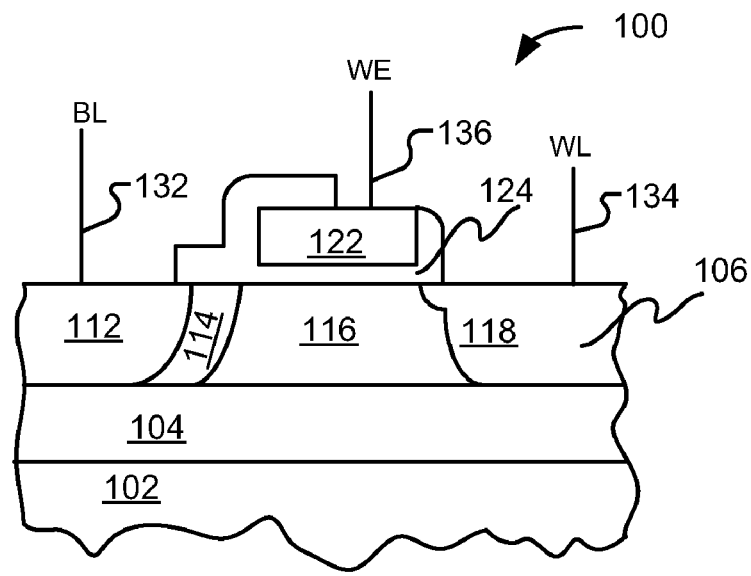

FIG. 1B is a simplified diagram showing an exemplary capacitively coupled thyristor memory cell 100 of the present invention. It comprises a semiconductor layer 106 disposed on an insulator, e.g., buried oxide 104, which is in turn disposed on a supporting substrate 102. The semiconductor layer 106 comprises base regions 114, 116, a cathode region 118 and an anode region 112. A gate 122 is disposed above at least a portion of the base regions and is separated therefrom by a dielectric 124. The at least a portion has a cross-section along a plane facing an interface between the contiguous base regions. In one embodiment, gate 122 and semiconductor layer 106 are configured and arranged so that the capacitive coupling between the gate and the at least a portion of the base regions changes the potential across a majority of the cross-section in response to at least one voltage transition presented to the gate and independent of MOS inversion channel formation. Further, the capacitive coupling does not involve avalanche breakdown of a diode structure formed between the base regions. This action enhances switching of the memory cell between a current-passing mode and a current-blocking mode. Gate 122 can be positioned above both base regions 114 and 116 together with the corresponding junction. Alternatively, gate 122 can be positioned over base region 116 and offset laterally from base region 114. Another form of thyristors that can be used in the present invention is vertical thyristors. The vertical thyristor can be located in a trench or above a substrate surface. Additional details of the structure of these kinds of thyristors can be found in U.S. Pat. Nos. 6,229,161 (titled "Semiconductor capacitively coupled NDR device and its applications in high-density high-speed memories and in power switches), 6,727,528 (titled "Thyristor-based device including trench dielectric isolation for thyristor body regions), 6,818,482 (titled "Method for trench isolation for thyristor-based device), 6,790,713 (titled "Method for making an inlayed thyristor-based device") and 6,767,770 (titled "Method of forming self-aligned thin capacitively-coupled thyristor structure). These patents are incorporated herein by reference. However, it should be noted that the present invention is not restricted to the thyristors described in these patents.

The thyristor used in the present invention can also be made using other ways. For example, the technique described in patent application Ser. No. 10/238,572 titled "Fin thyristor-based semiconductor device" can be used.

The performance of memory cell 100 can be improved by implanting leakage species into at least some of the junctions between regions 112, 114, 116 and 118. Examples of leakage species are germanium, xenon and carbon. Further, Indium may be implanted in at least one of the base regions. More detailed information about these implants can be found in U.S. Pat. No. 6,462,359 (titled "Stability in thyristor based memory device"), U.S. patent application Ser. No. 10/958,820 (titled "Thyristor based semiconductor device and method of fabrication") and U.S. patent application Ser. No. 10/670,881 (titled "Thyristor device with carbon lifetime adjustment implant and its method of fabrication"). These patent applications and patent are incorporated herein by reference.

In one aspect of the present invention, anode 112 is connected to a bit line (BL) 132, cathode 118 is connected to a word line (WL) 134, and gate 122 is connected to a write enable (WE) line 136. These lines are used to control the operation of the memory cell. More details about the connection of thyristor memory cell 100 are disclosed below.

Figure 1C:
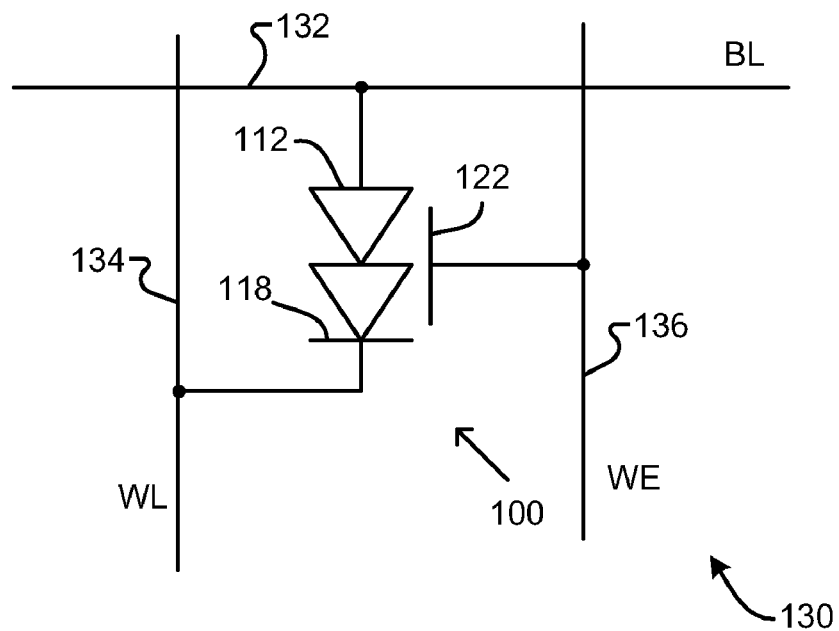

FIG. 1C is a schematic diagram 130 of the thyristor memory cell shown in FIG. 1B. It shows the anode 112, cathode 118, gate 122, bit line 132, word line 134 and write enable line 136.

FIG. 1D is a graph 140 illustrating the current-voltage DC characteristics of a thyristor device of the present invention. It has a non-conducting state 142. Upon application of a voltage larger than a forward blocking threshold voltage $V_{FB}$, the thyristor may abruptly transition to a conducting state 144. The thyristor stays at conducting state 144 while the current and voltage of the base regions drop slowly. When its current drops below a holding current $I_H$ (corresponding to a holding voltage $V_H$), the thyristor may abruptly transition to non-conducting state 142.

Figure 2:
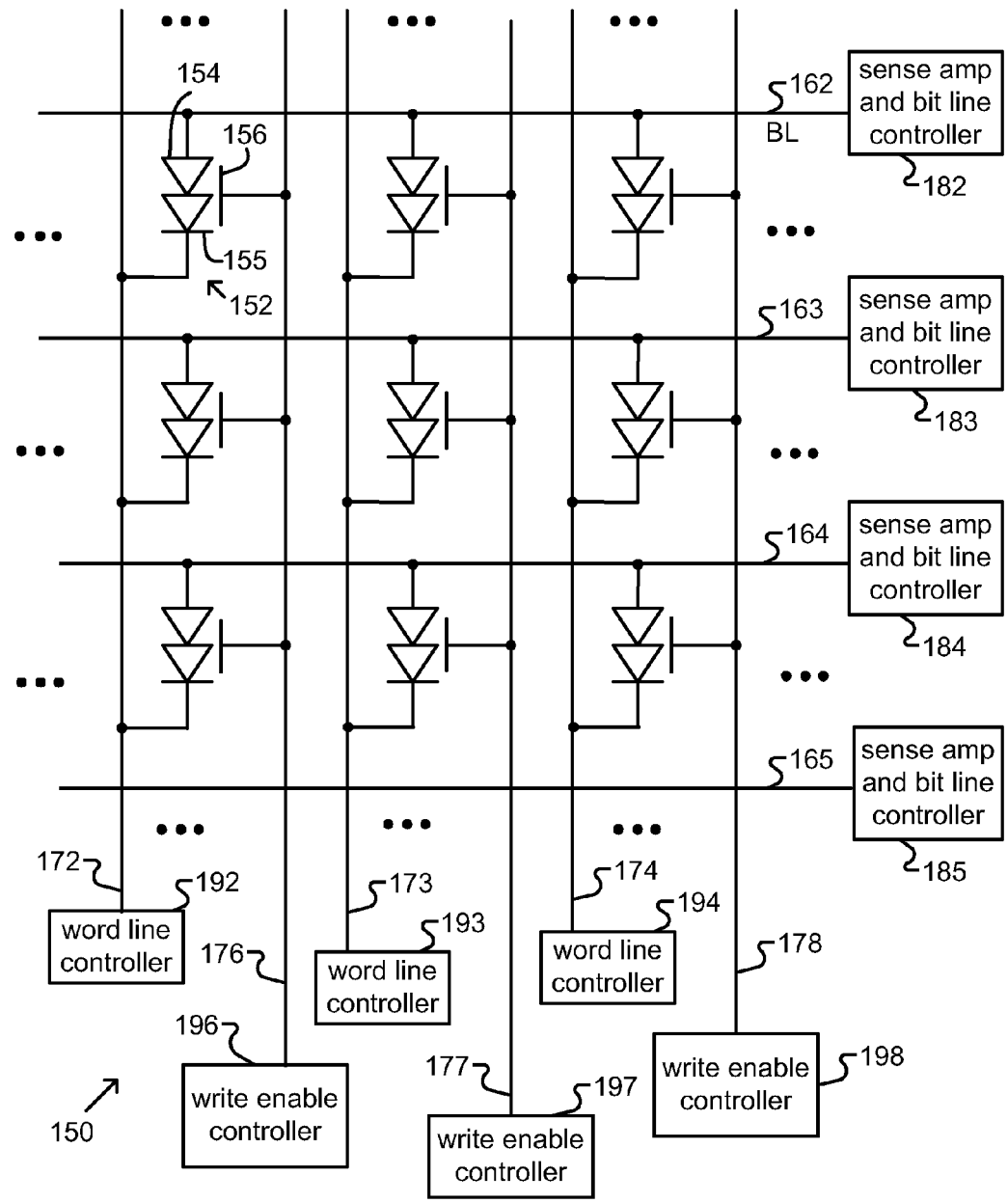
FIG. 2 is a schematic diagram of a portion of an exemplary memory array of the present invention.

A memory array can be formed using the thyristor memory cell of FIG. 1B. FIG. 2 shows a portion of an exemplary array 150 of the present invention. In FIG. 2, only three rows and three columns of thyristors are shown. It should be noted that the present invention is not restricted to any number of rows and columns. An exemplary thyristor 152 is described here. It has an anode 154, cathode 155 and gate 156 connected to a bit line 162, a word line 172 and a write enable line 176, respectively. FIG. 2 also shows other bit lines 163-165, other word lines 173-174 and other write enable lines 177-178.

In order to operate the array, a plurality of sense amplifier and bit line controllers 182-185, a plurality of word line controllers 192-194 and a plurality of write enable controllers 196-198 are used. These controllers provide the proper signals to various bit, word and write enable lines at appropriate times. The sense amplifiers are used to determine the data stored in the thyristors. Detailed description of the signal amplitude and timing at various lines of array 150 is provided below.

When a cell is in standby mode, there is no read, write or restore activities. An exemplary voltage arrangement at standby can be: (a) BL is set at 1.2V, (b) WE line is set at −1.2V, and (c) WL is set at 1.2V. It should be noted that the standby voltages of BL and WL do not need to be the same, although the voltage difference between BL and WL is preferably less than $V_{FB}$. Also note that the standby voltages of WE, BL and WL can be positive or negative.

Figure 3B:
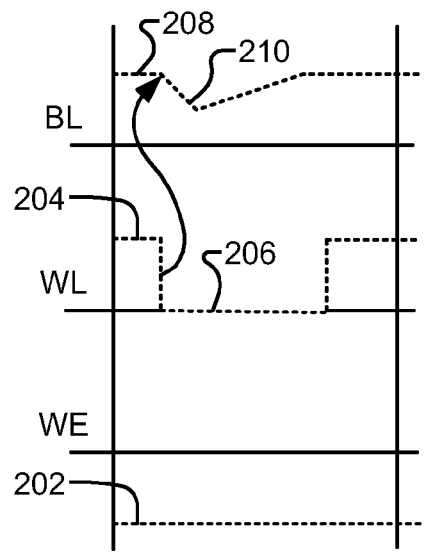
FIGS. 3A and 3B are signal diagrams for read operations of the present invention.
Figure 3A:
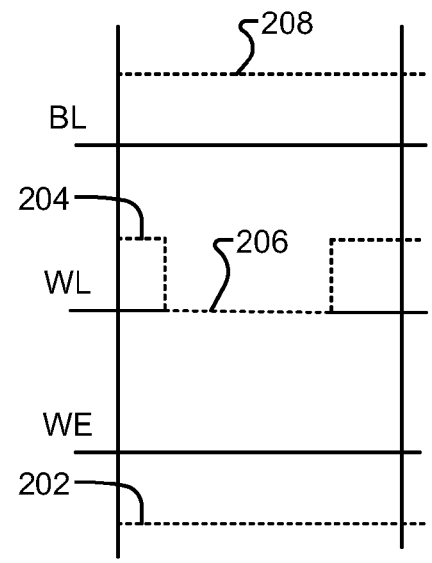

FIGS. 3A and 3B are signal diagrams for a read operation of the present invention when the data is at a "0" state and a "1" state, respectively. These states correspond to the two states of a thyristor: blocking and conducting. For illustrative purposes in the present disclosure, a "0" corresponds to blocking state and a "1" correspond to conducting state. In one embodiment, the WE line remains unchanged at the standby voltage 202 and the WL of the selected cell is pulled from the standby voltage 204 to a lower voltage 206. WL returns to its standby voltage near the end of the read cycle. The voltage of the BL (originally at standby 208) is sensed after WL is pulled low. If the voltage of BL remains substantially the same, then the state is "0" (see FIG. 3A). If the voltage of BL decreases 210, then the state is "1" (see FIG. 3B). Before the end of the read cycle, the voltage of BL returns to the standby level. Note that the return timing of BL can be independent of the return timing of WL.

Either voltage or current sensing can be used in read operations. In a current sensing scheme, the change in the BL voltage is typically smaller than voltage sensing. Thus, the sense amplifier senses flow of current or the impedance of the BL. If the thyristor is in a blocking state, the current sense amp sees a high impedance or a low current on the BL. If the thyristor is in a conducting state, the current sense amp senses a low impedance or a high current.

Figure 4B:
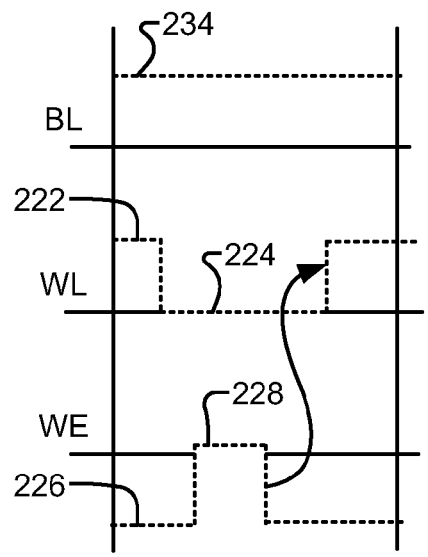
FIGS. 4A and 4B are signal diagrams for write operations of the present invention.
Figure 4A:
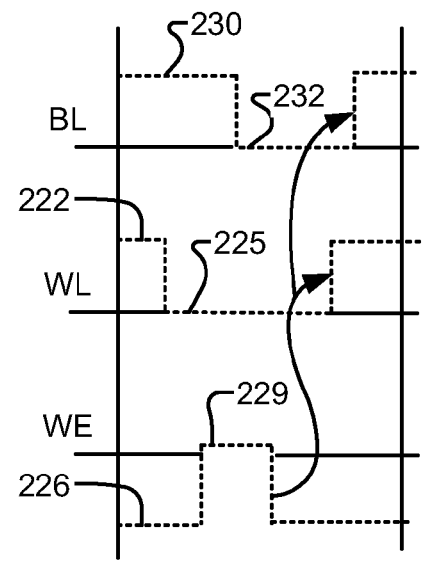

FIG. 4A shows signal diagram for write "0" operation of the present invention. In one embodiment, the BL and WL of the selected cell are pulled from their respective standby voltages (230 and 222) to a lower voltage 232 and 225, respectively. In one embodiment, voltage 232 of BL minus voltage 225 of WL is to be low enough so that the potential of one of the base regions can be substantially modulated by the WE line. The WE line is pulsed to a higher voltage 229 (either before or after the voltage change of BL and WL). Voltage 229 is higher than the standby voltage by more than about 1V. In one embodiment, voltage 229 can vary from 0V to 3.0V. After the WE line returns to its standby voltage, the BL and WL return to their standby voltages.

FIG. 4B shows signal diagrams for write "1" operation of the present invention. In one embodiment, the WL of the selected cell is pulled from the standby voltage 222 to a lower voltage 224, and will return to the standby voltage near the end of the write cycle. The WE line is pulsed from the standby voltage 226 to a higher voltage 228 (either before or after the rising edge of the WL) and then returns to the standby voltage. This higher voltage is higher than the standby voltage by more than about 1V. In one embodiment, voltage 228 can vary between 0V to 3.0V. For a "1" is to be written to the selected cell, the BL remains at the standby voltage 234 throughout the write cycle.

The signal diagrams illustrated in FIGS. 3A-3B and 4A-4B can be easily implemented by sense amp and bit line controllers 182-185, word line controllers 192-194, and write enable controller 196-198.

The data retention and power consumption of the memory array 150 of the present invention can be improved by periodically refreshing the memory cells. Refresh is one method for maintaining data in the memory cells. The data in a cell selected for refresh is read and then written back to the cell. In a refresh operation, a sense amplifier needs to be used to read the data. Word line and write enable controllers are used to write back the data. The refresh operation can be applied approximately once every 0.01 to 10,000 milliseconds.

Another method to maintain data in the memory cells of memory array 150 is by periodically restoring the state of the memory cells. One of the states of a thyristor (e.g., "1") can gradually transition to another state (e.g., "0") during standby. However, data in the thyristor can be self-restored by periodically pulsing at least one of the three lines connected to the thyristor. There is no need to involve the sense amplifier or perform read/write operations. In one embodiment of the present invention, the restore operation involves periodically pulsing the word lines of array 150 from the standby voltage to a lower voltage. The pulse width can vary from 0.1 ns to 10 ns. The time interval between restore pulses can vary from 0.01 ms to 500 ms. Background information about restore operation can be found in U.S. Pat. No. 6,885,581 titled "Dynamic data restore in thyristor based memory device." This patent is incorporated herein by reference. The restore operation can be easily implemented by word line controllers 192-194.

Figure 5A:
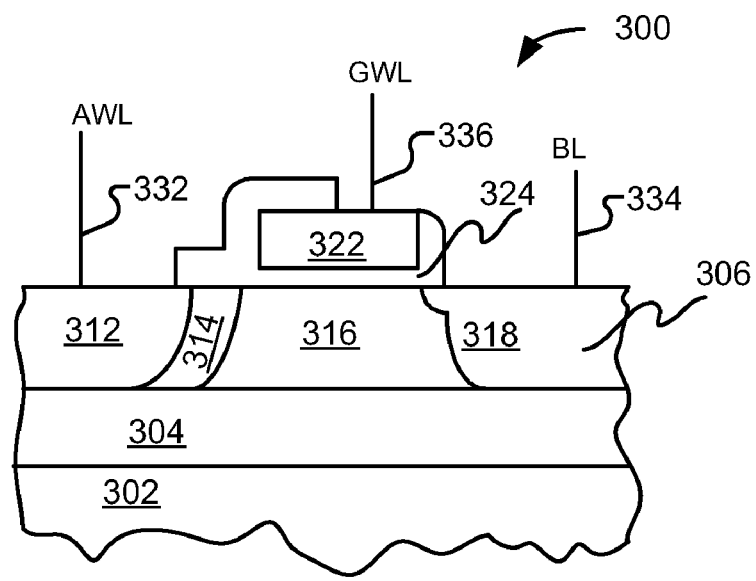
FIGS. 5A and 5B show another exemplary capacitively coupled thyristor memory cell of the present invention.

Another embodiment of the present invention is now described. FIG. 5A is a simplified diagram showing an exemplary capacitively coupled thyristor memory cell 300 of the present invention. It comprises a semiconductor layer 306 disposed on an insulator, e.g., buried oxide 304, which is in turn disposed on a supporting substrate 302. The semiconductor layer 306 comprises base regions 314, 316, a cathode 318 and an anode 312. A gate 322 is disposed above semiconductor layer 306 and is separated from layer 306 by a dielectric 324. The disclosure above regarding capacitive coupling and various embodiments of thyristors is also applicable here. In one aspect of the present invention, anode 312 is connected to a word line 332 (called "anode word line", or AWL), cathode 318 is connected to a bit line (BL) 334, and gate 322 is connected to a gate word line (GWL) 336. These lines are used to control the operation of the memory cell. More details about the connection of thyristor memory cell 300 are disclosed below.

Figure 5B:
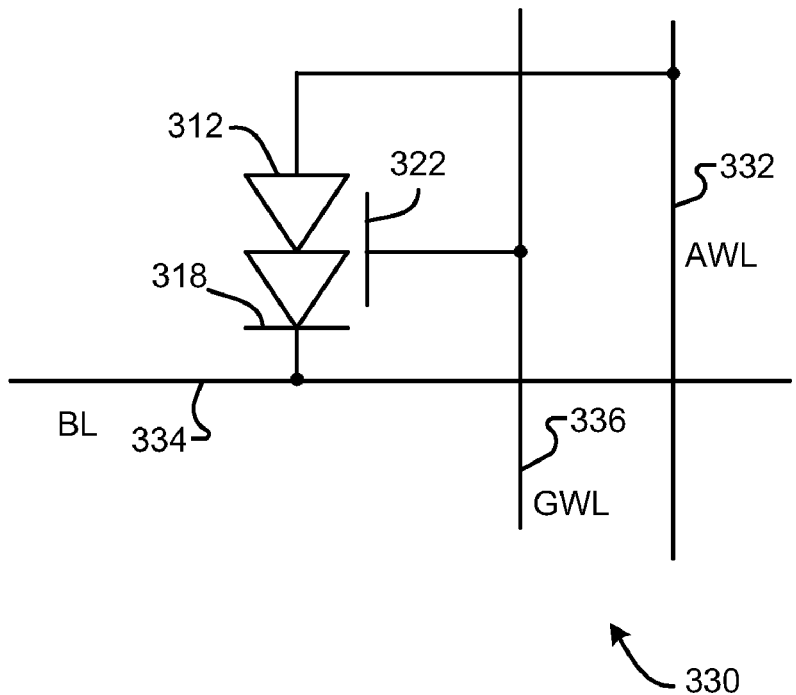

FIG. 5B is a schematic diagram 330 of the thyristor memory cell shown in FIG. 5A. It shows anode 312, cathode 318, gate 122, BL 334, AWL 332 and GWL 336.

Figure 6:
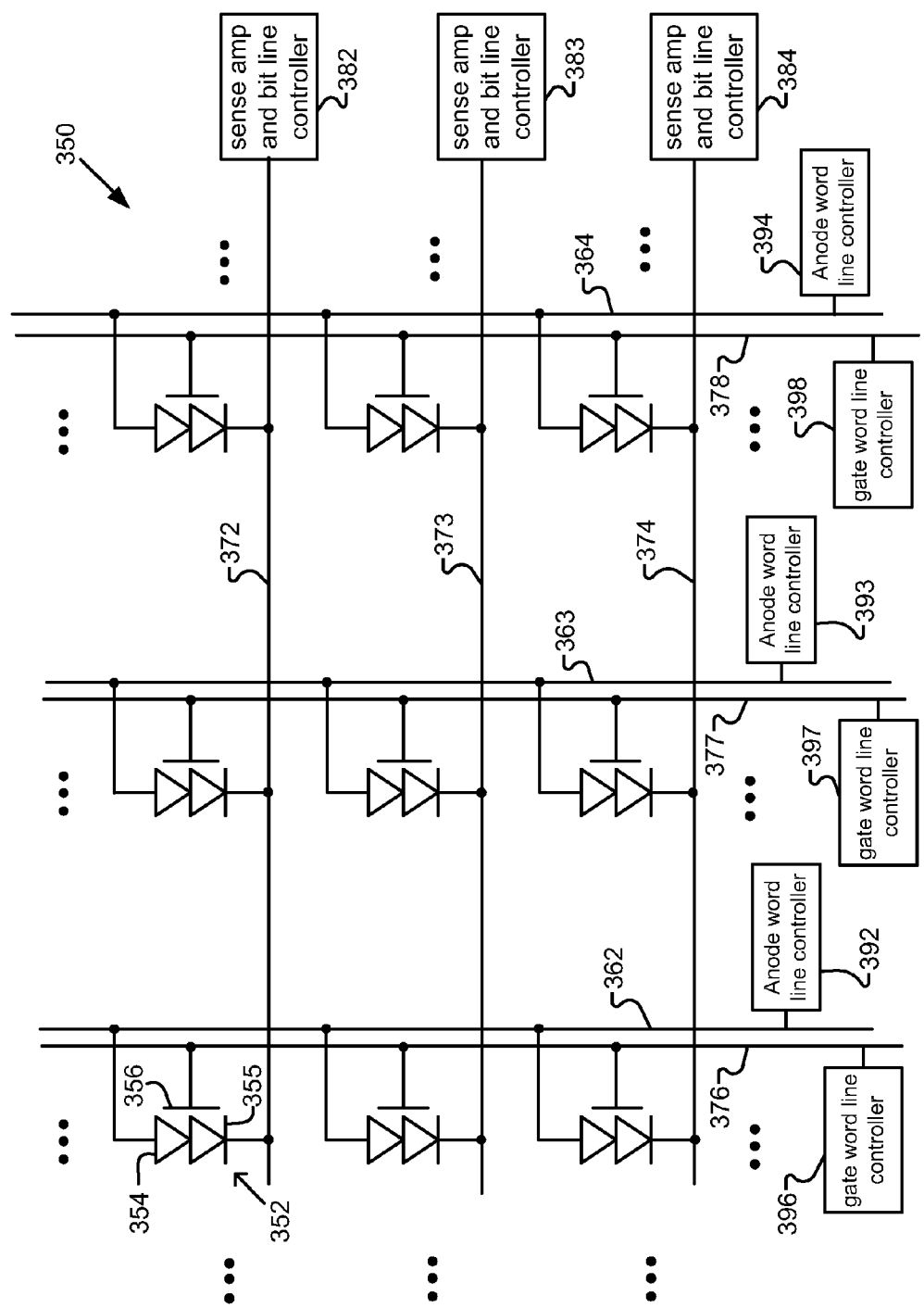
FIG. 6 is a schematic diagram of a portion of another exemplary memory array of the present invention.

A memory array can be formed using the thyristor memory cell of FIG. 5A. FIG. 6 shows a portion of an exemplary array 350 of the present invention. In FIG. 6, only three rows and three columns of thyristors are shown. It should be noted that the present invention is not restricted to any number of rows and columns. An exemplary thyristor 352 is described here. It has an anode 354, cathode 355 and gate 356 connected to AWL 362, BL 372 and GWL 376, respectively. FIG. 6 also shows other anode word lines 163-164, other bit lines 373-374 and other gate word lines 377-378.

In order to operate the array, a plurality of sense amplifier and bit line controllers 382-384, a plurality of anode word line controllers 392-394 and a plurality of gate word line controllers 396-398 are used. These controllers provide the proper signals to various bit, anode word and gate word lines at appropriate times. The sense amplifiers are used to determine the data stored in the thyristors. Detailed description of the signal amplitude and timing at various lines of array 350 is provided below.

An exemplary voltage arrangement at standby can be: (a) BL and AWL are set at approximately ground level, and (b) GWL is set at approximately −1.0V. It should be noted that during standby, the voltages at BL and AWL do not need to be the same, although they are preferably close to each other (e.g., less than $V_H$). AWL can be between 0V and 3.0V.

FIGS. 7A and 7B are signal diagrams for a read operation of the present invention when the data is at a "0" state and a "1" state, respectively. In one embodiment, the AWL of the selected cell is pulsed from a standby voltage 402 to a high voltage 404, and then returns to its standby voltage near the end of the read cycle. Preferably, voltage 404 is about 0.5V or more higher than the voltage of BL so that the thyristor passes sufficient current to meet the required read speed. An exemplary value of voltage 404 is approximately 1.2V. GWL is also pulsed from its standby voltage 406 to a higher voltage 408 (before or after the rise of AWL), and then returns to its standby voltage (also before or after the fall of AWL). In one embodiment, the voltage difference between voltages 408 and 406 of GWL is approximately 1.0V. This voltage should be large enough to trigger a cell containing data "1" into conducting state while not disturbing a cell that contains data "0" into conducting state. Actual value is a function of efficiency in coupling GWL signal into the base region. The value can be between 0.5V to 1.5V.

In read operation, BL is pre-charged to approximately ground level 410. The voltage of BL is sensed after GWL is pulsed. If the voltage of BL remains substantially the same, the state of the thyristor is "0" (see FIG. 7A). If the voltage of BL rises (e.g., to a voltage 412), the state of the thyristor is "1" (see FIG. 7B). One exemplary voltage rise is 0.3V. Typically, the voltage can be about 0.5V to 1.0V lower than the voltage of AWL.

FIGS. 8A and 8B are signal diagrams for write "0" and write "1" operations, respectively, of the present invention. In one embodiment, the AWL of the selected cell is pulsed from the standby voltage 422 to a high voltage 424, and then returns to the standby voltage near the end of the write cycle. Also, the voltage of GWL is raised from its standby voltage 426 to a high voltage 428 (either before or after the rising edge of AWL), and then returns to its standby voltage while the voltage of AWL is still at high voltage 424. In one embodiment, the voltage swing of GWL is greater than 1V, and in a specific embodiment, approximately 2.5V. If a "0" is to be written to the selected cell, BL is also pulsed from its standby voltage 430 to a higher voltage 432. In one embodiment, BL rises after GWL is pulsed to voltage 428, but this is not required. The BL voltage 432 should be high enough to result in a low current through the thyristor. A voltage that results in 0.8V or less voltage drop across the thyristor works better. In one embodiment, voltage 432 is 1.2V. BL returns to its standby voltage after the falling edge of the GWL. If a "1" is to be written to the selected cell, BL stays at the standby voltage.

The signal diagrams illustrated in FIGS. 7A-7B and 8A-8B can be easily implemented by sense amp and bit line controllers 382-385, anode word line controllers 392-394, and gate word line controller 396-398.

As explained above in connection with memory array 150 of FIG. 2, data in the memory cells of array 350 can be maintained either by periodically refreshing or restoring the memory cells. When thin capacitively coupled thyristor memory cells are used in array 350, refresh is preferably used to maintain data.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof.

What is claimed is:

1. A memory array comprising:
   at least one word line;
   at least one bit line;
   at least one third line;
   at least one thyristor having an anode, a cathode, and at least one base region, the anode being connected to one of the at least one word line, bit line and third line, the cathode being connected to another of the at least one word line, bit line, and third line, and the at least one base region being capacitively coupled to a remaining one of the at least one word line, bit line and third line;
   at least one word line controller;
   at least one bit line controller;
   at least one third line controller;
   wherein the anode and the cathode are at least at substantially the same voltage during standby;
   wherein the voltage during standby for the anode is provided from one of the at least one word line controller and the at least one bit line controller; and
   wherein the voltage during standby for the cathode is provided from a remaining one of the at least one word line controller and the at least one bit line controller.

2. The memory array of claim 1 wherein the anode is connected to the at least one bit line, the cathode is connected to the at least one word line, and the at least one base region is capacitively coupled to the at least one third line.

3. The memory array of claim 2 wherein the at least one thyristor has a first and a second state, and the at least one third line is pulsed during a write operation for at least one of the states.

4. The memory array of claim 3 wherein the at least one word line changes from its standby voltage during the write operation and the at least one bit line changes from its standby voltage during the write operation for only one of the states.

5. The memory array of claim 2 wherein the at least one word line changes from its standby voltage during a read operation.

6. The memory array of claim 1 wherein the anode is connected to the at least one word line, the cathode is connected to the at least one bit line, and the at least one base region is capacitively coupled to the at least one third line.

7. The memory array of claim 6 wherein the at least one thyristor has a first and a second state, and the at least one third line is pulsed during a write operation for at least one of the states.

8. The memory array of claim 7 wherein the at least one word lien changes from its standby voltage during the write operation and the at least one bit line changes from its standby voltage during the write operation for only one of the states.

9. The memory array of claim 6 wherein the at least one word line changes from its standby voltage during a read operation.

10. A memory array comprising:
    at least one word line;
    at least one bit line;
    at least one third line;
    at least one thyristor having an anode, a cathode, and at least one base region, the anode being connected to one of the at least one word line, bit line and third line, the cathode being connected to another of the at least one word line, bit line, and third line, and the at least one base region being capacitively coupled to a remaining one of the at least one word line, bit line, and third line;
    at least one word line controller;
    at least one bit line controller;
    at least one third line controller; and
    wherein the remaining one of the at least one word line, bit line and third line has a negative voltage value during standby.

11. The memory array of claim 10 wherein the anode is connected to the at least one bit line, the cathode is connected to the at least one word line, and the at least one base region is capacitively coupled to the at least one third line.

12. The memory array of claim 11 wherein the at least one thyristor has a first and a second state, and the at least one third line is pulsed during a write operation for at least one of the states.

13. The memory array of claim 12 wherein the at least one word line changes from its standby voltage during the write operation and the at least one bit line changes from its standby voltage during the write operation for only one of the states.

14. The memory array of claim 11 wherein the at least one word line changes from its standby voltage during a read operation.

15. The memory array of claim 10 wherein the anode is connected to the at least one word line, the cathode is connected to the at least one bit line, and the at least one base region is capacitively coupled to the at least one third line.

16. The memory array of claim 15 wherein the at least one thyristor has a first and a second state, and the at least one third line is pulsed during a write operation for at least one of the states.

17. The memory array of claim 16 wherein the at least one word line changes from its standby voltage during the write operation and the at least one bit line changes from its standby voltage during the write operation for only one of the states.

18. The memory array of claim 15 wherein the at least one word line changes from its standby voltage during a read operation.

* * * * *